US008692276B2

(12) United States Patent
Doany et al.

(10) Patent No.: US 8,692,276 B2
(45) Date of Patent: Apr. 8, 2014

(54) PARALLEL OPTICAL TRANSCEIVER MODULE

(71) Applicant: International Business Machines Corporation, Armonk, NY (US)

(72) Inventors: Fuad E. Doany, Katonah, NY (US); Christopher V. Jahnes, Saddle River, NJ (US); Clint L. Schow, Ossining, NY (US); Mehmet Soyuer, Stamford, CT (US); Alexander V. Rylyakov, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/947,906

(22) Filed: Jul. 22, 2013

(65) Prior Publication Data
US 2013/0308900 A1 Nov. 21, 2013

Related U.S. Application Data

(62) Division of application No. 13/757,040, filed on Feb. 1, 2013, now Pat. No. 8,536,610, which is a division of application No. 12/827,825, filed on Jun. 30, 2010, now Pat. No. 8,399,292.

(51) Int. Cl.
*H01L 27/15* (2006.01)

(52) U.S. Cl.
USPC ............. 257/98; 257/79; 257/85; 438/22; 438/24

(58) Field of Classification Search
USPC .......... 257/79, 97–99, 678, 687, 774; 438/22, 438/24, 106, 108
See application file for complete search history.

(56) References Cited

U.S. PATENT DOCUMENTS

| 6,236,786 | B1 | 5/2001 | Aoki et al. |
| 6,512,861 | B2 | 1/2003 | Chakravorty et al. |
| 7,352,066 | B2 | 4/2008 | Budd et al. |
| 7,454,102 | B2 | 11/2008 | Keyser et al. |
| 7,466,880 | B2 * | 12/2008 | Windover ............... 385/14 |
| 7,489,025 | B2 | 2/2009 | Chen et al. |
| 7,645,076 | B2 | 1/2010 | Martini et al. |
| 7,736,949 | B2 | 6/2010 | Chen et al. |
| 8,111,730 | B2 | 2/2012 | Budd et al. |
| 8,399,292 | B2 | 3/2013 | Doany et al. |
| 2008/0318360 | A1 | 12/2008 | Chen et al. |
| 2009/0136237 | A1 | 5/2009 | Martini et al. |
| 2009/0263923 | A1 | 10/2009 | Shimooka |
| 2011/0044367 | A1 | 2/2011 | Budd et al. |
| 2012/0001166 | A1 | 1/2012 | Doany et al. |
| 2013/0142211 | A1 | 6/2013 | Doany et al. |

OTHER PUBLICATIONS

Matsubara et al., "Three Dimensional Optical Interconnect on Organic Circuit Board," 2006 Electronic Components and Technology Conference, May-Jun. 2006, pp. 789-794.

(Continued)

*Primary Examiner* — Dung A. Le
(74) *Attorney, Agent, or Firm* — Yee & Associates, P.C.; Anne Dougherty

(57) ABSTRACT

A silicon-on-insulator wafer is provided. The silicon-on-insulator wafer includes a silicon substrate having optical vias formed therein. In addition, an optically transparent oxide layer is disposed on the silicon substrate and the optically transparent oxide layer is in contact with the optical vias. Then, a complementary metal-oxide-semiconductor layer is formed over the optically transparent oxide layer.

6 Claims, 6 Drawing Sheets

(56) References Cited

OTHER PUBLICATIONS

Persans et al., "Optical Interconnect Components for Wafer Level Heterogeneous Hyper-Integration," Mat. Res. Soc. Symp. Proc. vol. 812, Apr. 2004, 5 pages.

Office Action, dated Jul. 26, 2012, regarding U.S. Appl. No. 12/827,825, 10 pages.

Notice of Allowance, dated Nov. 14, 2012, regarding U.S. Appl. No. 12/827,825, 5 pages.

Notice of Allowance, dated May 9, 2013, regarding U.S. Appl. No. 13/757,040, 15 pages.

* cited by examiner

PARALLEL OPTICAL TRANSCEIVER MODULE

This application is a Divisional of, and claims the benefit of priority to, U.S. patent application Ser. No. 13/757,040, filed on Feb. 1, 2013 and entitled "Parallel Optical Transceiver Module", status allowed, which is a Divisional of, and claims the benefit of priority to, U.S. patent application Ser. No. 12/827,825, filed on Jun. 30, 2010 and entitled "Fabricating a Semiconductor Chip with Backside Optical Vias", issued as U.S. Pat. No. 8,399,292, the contents of which are hereby incorporated by reference.

This invention was made with Government support under Contract No.: H98230-07-C-0409 awarded by National Security Agency. The Government has certain rights in this invention.

BACKGROUND

1. Field

The disclosure relates generally to an improved data processing system, and more specifically, to a parallel optical transceiver module using a complimentary metal-oxide-semiconductor chip with backside optical vias.

2. Description of the Related Art

Currently, commercial parallel optical modules are based on industry-standard 850 nanometer (nm) wavelength vertical cavity surface emitting laser (VCSEL) and photodiode optoelectronic (OE) devices. Typically, arrays of these optoelectronic devices are fabricated on a semiconductor substrate, such as gallium arsenide (GaAs) or indium phosphide (InP). Optical input and output is directed to and from the top surface of the semiconductor substrate because gallium arsenide and indium phosphide substrates are not transparent to a wavelength at substantially 850 nanometers. The current packaging of parallel optical transmitter, receiver, and transceiver modules typically requires multiple levels of packaging, which results in complex and costly optical modules.

Typically, 850 nanometer wavelength optoelectronic devices are packaged in a side-by-side configuration. That is, the optoelectronic devices are electrically interconnected to driver integrated circuits (ICs) either by wire bonds or through an intermediate electrical carrier. Then, the integrated circuits may be connected to the next level package either by additional wire bonds or through additional wiring on the intermediate electrical carrier. As a result, existing packaging solutions may be complex, costly, and limited in high speed performance due to electrical packaging parasitics.

SUMMARY

According to one embodiment of the present invention, a silicon-on-insulator wafer is provided. The silicon-on-insulator wafer includes a silicon substrate having optical vias formed therein. In addition, an optically transparent oxide layer is disposed on the silicon substrate, and the optically transparent oxide layer is in contact with the optical vias. In a top silicon layer above the optically transparent oxide layer and the silicon substrate, electrical devices are fabricated to implement amplifier and/or logic circuits. Photonic devices may also be fabricated in the top silicon layer. A typical fabrication process for these electrical and photonic circuits is a complementary metal-oxide-semiconductor process.

DETAILED DESCRIPTION

With reference now to the figures, and in particular, with reference to FIGS. 1-4, diagrams of apparatuses are provided in which illustrative embodiments may be implemented. It should be appreciated that FIGS. 1-4 are only meant as examples and are not intended to assert or imply any limitation with regard to the apparatuses in which different embodiments may be implemented. Many modifications to the depicted apparatuses may be made.

Figure 1:
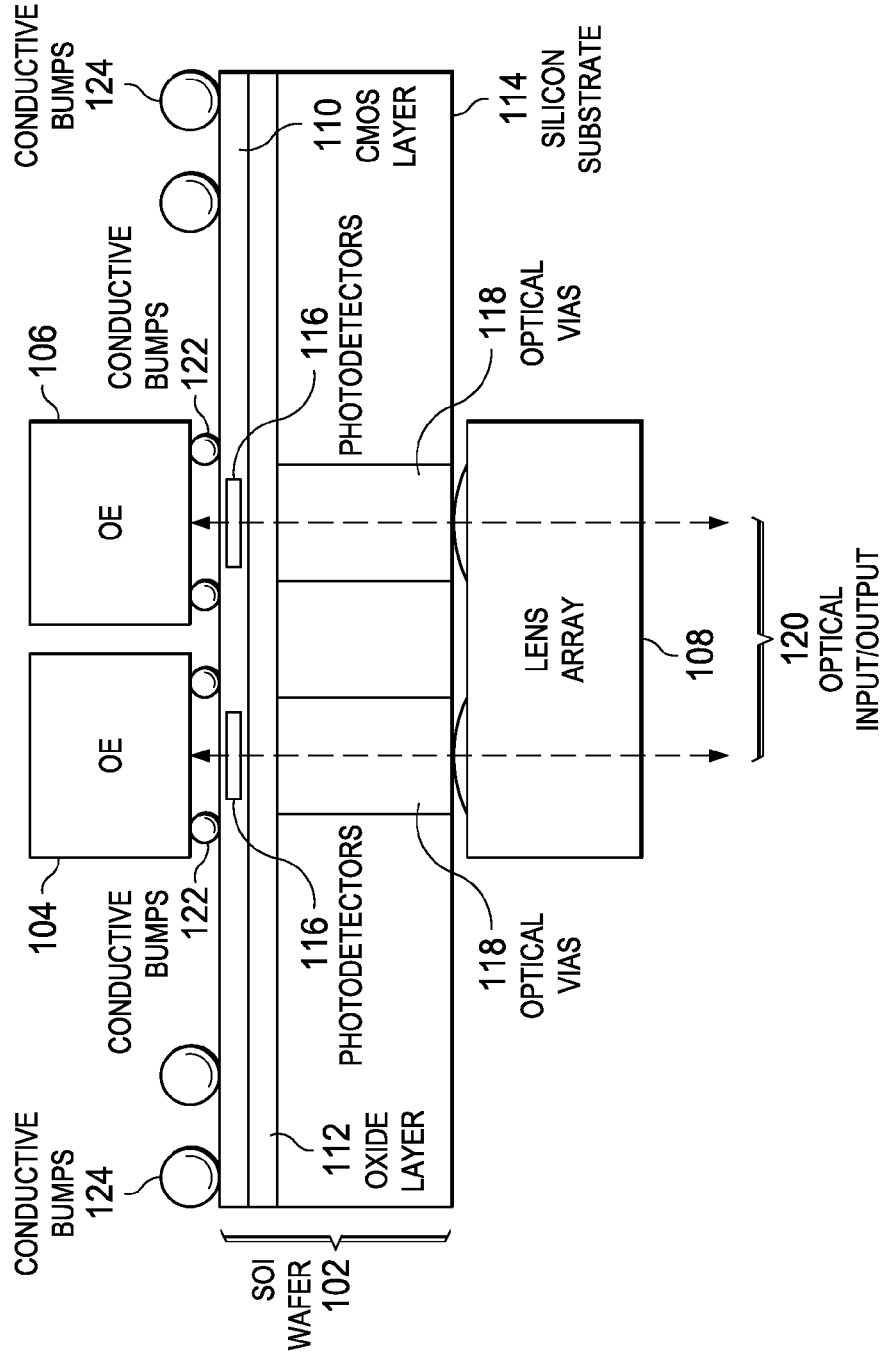
FIG. 1 is a diagram of a cross-section view of an optical transceiver assembly in accordance with an illustrative embodiment.

FIG. 1 depicts a diagram of a cross-section view of an optical transceiver assembly in accordance with an illustrative embodiment. Optical transceiver assembly 100 is an electrical and optical component that is capable of transmitting and receiving pulses of light, which are used to communicate data. Optical transceiver assembly 100 includes silicon-on-insulator (SOI) wafer 102, optoelectronic device 104, optoelectronic device 106, and lens array 108.

Silicon-on-insulator wafer 102 is an example of a semiconductor chip that may be used in a data processing system. Silicon-on-insulator wafer 102 includes complementary metal-oxide-semiconductor (CMOS) layer 110, oxide layer 112, and silicon substrate 114. CMOS layer 110 includes the active circuitry of silicon-on-insulator wafer 102. The thickness of CMOS layer 110 may, for example, be 0.01-0.5 micrometers (um). This 0.01-0.5 micrometer thickness of CMOS layer 110 is essentially transparent with transmission of greater than 95%, or less than 1 decibel (dB) loss, at a wavelength of 850 nanometers.

Optoelectronic device 104 and optoelectronic device 106 are flip chip attached to the active circuitry of CMOS layer 110 by conductive bumps 122. Flip chip offers increased high speed electrical performance. Flip chip is one type of surface mount technology (SMT) used for semiconductor devices that does not require wire bonds. Eliminating bond wires reduces the delaying inductance and capacitance of a connection. The result is a higher speed interconnection.

Optoelectronic device 104 and optoelectronic device 106 represent a 2×N array of optoelectronic devices, where N equals any positive whole number. For example, optoelectronic device 104 and optoelectronic device 106 may be a 2×1, 2×2, 2×4, 2×6, or 2×8 array of optoelectronic devices. However, it should be noted that illustrative embodiments may include any number of optoelectronic devices in the array. For example, the array may be an M×N array where M equals any positive whole number, such as 2 to 10. In addition, optoelectronic device 104 and optoelectronic device 106 represent different types of optoelectronic devices.

In this example, optoelectronic device 104 is a vertical cavity surface emitting laser. As a result, optical transceiver assembly 100 uses optoelectronic device 104 as a transmitter to output pulses of light. Further, optoelectronic device 106 is a photodiode. Consequently, optical transceiver assembly 100 uses optoelectronic device 106 to receive pulses of light as input. As a result, the active circuitry in CMOS layer 110 acts as a CMOS laser driver to modulate the output of the pulses of light from optoelectronic device 104 to represent ones and zeros for communicating data. Furthermore, the active circuitry in CMOS layer 110 acts as a receiver chip to convert received pulses of light from optoelectronic device 106 into electrical signals.

The active circuitry for the one or more laser drivers and the one or more photodiode receivers in CMOS layer 110 may also include other types of circuitry, such as, for example, decoupling capacitors, resistors, inductors, and/or integrated active devices. The integrated active devices may, for example, include voltage regulators and/or memory circuits. The voltage regulators may, for example, provide the ability to regulate or segment voltages to each optoelectronic device flip chip attached to silicon-on-insulator wafer 102 to support multiple voltage levels. In addition, the voltage regulators may also provide an ability to power on and power off optoelectronic devices individually.

In an alternative illustrative embodiment, optoelectronic device 104 and optoelectronic device 106 represent a 2×N array of the same type of optoelectronic device. Thus, if optoelectronic device 104 and optoelectronic device 106 are both vertical cavity surface emitting lasers, then optical transceiver assembly 100 is a laser driver and acts as a transmitter. Similarly, if optoelectronic device 104 and optoelectronic device 106 are both photodiodes, then optical transceiver assembly 100 is a receiver chip and acts as a receiver.

Optoelectronic device 104 and optoelectronic device 106 are flip chip attached over optical vias 118. Optical vias 118 are small, cylindrical columns or blind holes located on the backside of silicon-on-insulator wafer 102. Optical vias 118 have diameters of 10-500 micrometers. However, optical vias 118 do not form through holes in silicon-on-insulator wafer 102.

Optical vias 118 are composed of air within silicon substrate 114. Silicon substrate 114 is a bulk silicon layer that provides support for silicon-on-insulator wafer 102. Oxide layer 112 acts as an etch-stop during the formation of optical vias 118. Oxide layer 112 may, for example, be a silicon dioxide layer. In addition, oxide layer 112 is a transparent layer that allows light to pass through it. Oxide layer 112 may range in thickness from 10 nanometers to 10 micrometers, for example.

Optical vias 118 allow optical input/output 120 to pass through optical transceiver assembly 100 to and from optoelectronic device 104 and optoelectronic device 106. Optical input/output 120 represents pulses of light for communicating data to and from optical fibers or optical circuits. Also, CMOS layer 110 includes photodetectors 116, which are integrated active devices. For transmitter optoelectronic devices, such as vertical cavity surface emitting lasers, these built-in photodetectors in CMOS layer 110 may, for example, be used as monitor photodetectors that detect the optical power output of the vertical cavity surface emitting lasers. Then, through feedback provided by the built-in photodetectors the bias currents of the vertical cavity surface emitting lasers are adjusted to maintain constant power over both the temperature and the lifetime of the optoelectronic transmitters. For receiver optoelectronic devices, such as photodiodes, the built-in photodetectors in CMOS layer 110 may, for example, be used to monitor the incident direct current optical power independent of the operation of the high-speed photodiode in the receiver channel. This monitored information may be used to optimize the gain, bandwidth, and power consumption of the receiver amplifiers in a feed-back loop.

Lens array 108 is a 2×N array of optical lens. Lens array 108 is located on the backside of silicon-on-insulator wafer 102 that includes optical vias 118, whereas optoelectronic device 104 and optoelectronic device 106 are located on the frontside of silicon-on-insulator wafer 102. The backside of silicon-on-insulator wafer 102 does not contain any active circuitry, whereas the frontside does include active circuitry.

Lens array 108 is an array of integrated lens that are positioned in alignment with optical vias 118. However, it should be noted that the number of integrated lens within lens array 108 may or may not correspond with the number of optoelectronic devices flip chip attached to silicon-on-insulator wafer 102. Lens array 118 provides more efficient optical coupling between optoelectronic device 104 and optoelectronic device 106 and optical fibers or optical circuits. In addition, lens array 108 may provide for greater coupling distances between optoelectronic device 104 and optoelectronic device 106 and the optical fibers or circuits by focusing the pulses of light to the optoelectronic devices. Optical input/output 120 represents the pulses of light that are focused through lens array 108 to and from optoelectronic device 104 and optoelectronic device 106.

Optoelectronic device 104 and optoelectronic device 106 are electronically connected to silicon-on-insulator wafer 102 via conductive bumps 122. Similarly, optical transceiver assembly 100 is electronically connected to an organic or ceramic carrier, such as a printed circuit board (PCB), via conductive bumps 124. Conductive bumps 122 and 124 may, for example, be solder bumps, gold balls, molded studs, or electrically conductive plastics. This type of mounting is also known as the Controlled Collapse Chip Connection, or C4. In addition, this type of mounting leaves a small space between the chip's circuitry and the underlying substrate or mounting. An electrically-insulating adhesive may be "under filled" in this small space to provide a stronger mechanical connection, provide a heat bridge, and to ensure conductive bumps 122 and 124 are not stressed due to different coefficients of thermal expansion of the different components.

Thus, illustrative embodiments provide flip chip attachment of 2×N arrays of 850 nanometer wavelength optoelectronic devices directly onto a transceiver or laser driver/light amplifier CMOS integrated circuit chip. The CMOS integrated circuit chip includes optical vias under each optoelectronic device, such that the input and output of light pulses are directed through the backside of the transceiver CMOS integrated circuit chip. Peripheral conductive bumps on the CMOS integrated circuit chip are used to flip chip attach the optical transceiver assembly to an organic or ceramic carrier. These peripheral attachment points are used to transmit electrical input and output signals to and from the CMOS integrated circuit chip. Typically, these conductive bumps or pads are 100 micrometers on a 200 micrometer pitch or 75 micrometers on a 150 micrometer pitch. Alternatively, the conductive bumps or pads can also be of smaller dimensions, such as, for example, 10 micrometers on a 20 micrometer pitch.

The CMOS integrated circuit chip is fabricated using standard CMOS fabrication processes. An area on the CMOS integrated circuit chip, which does not contain active circuitry, is reserved for the optical vias. Preferably, the area reserved for the optical vias is near the center of the CMOS integrated circuit chip. The active laser driver and photodiode receiver circuits may be designed with output bumps or pads located near the optical vias.

Once standard CMOS fabrication of the CMOS integrated circuit chip is completed, additional processing of the wafer is used to fabricate the optical vias. Standard photolithographic processes, such as, for example, photoresist application and photo exposure, are used to define the optical vias. Reactive ion etching (RIE) is used to etch nearly cylindrical optical vias in the backside of the wafer. In addition, optional backside grinding, polishing, or etching of the wafer may be used to thin the wafer to 10-500 micrometers.

Then, arrays of optoelectronic devices, such as vertical cavity surface emitting lasers and photodiodes, are directly flip chip attached to the CMOS integrated circuit chip using the optoelectronic device attach pads on the CMOS integrated circuit located near the optical vias. The optoelectronic devices are positioned in alignment with the optical vias on the CMOS integrated circuit chip. A Gold-Tin (AuSn) solder alloy may, for example, be used for this flip chip attachment. The completed optical transceiver assembly is then flip chip attached using the peripheral conductive bumps or pads to the organic or ceramic carrier. The organic or ceramic carrier may, for example, provide a conventional ball grid array (BGA) of bond pads on the bottom surface for surface mounting to a conventional FR4 system printed circuit board. Furthermore, a lens array may be integrated into the backside of the CMOS integrated circuit chip over the optical vias to provide more efficient optical coupling between the optoelectronic devices and optical fibers or waveguides.

The optical vias of illustrative embodiments are regions of the CMOS integrated circuit chip that are either transparent or nearly-transparent so that optical signals can be routed through the CMOS integrated circuit chip with a small amount of optical signal attenuation. The nearly-transparent illustrative embodiment, which retains the thin CMOS silicon layer in the optical vias, may provide optical monitoring functions. A further benefit is that the collimating lens array may provide an increased assembly tolerance. Furthermore, illustrative embodiments may use a single photolithographic step to co-etch into the backside of the silicon substrate a passive mechanical alignment guide for the lens array, while simultaneously co-etching the optical vias.

Therefore, illustrative embodiments are able to leverage current silicon substrate and silicon-on-insulator substrate processing technologies to improve electro-optical module packaging. Illustrative embodiments provide an optical transceiver module that incorporates optical vias in a CMOS integrated chip with flip-chip attached optoelectronic devices. The optical vias provide a means for optical coupling from the optoelectronic devices' surface mounted to the frontside surface of the CMOS integrated chip to a fiber array located in close proximity to the backside surface of the CMOS integrated circuit.

Illustrative embodiments improve on previous optical through-hole technology by separating the optical via from the active CMOS circuitry using a protective, transparent oxide isolation layer between the optical via and the active CMOS circuitry. One benefit of using an integrated oxide isolation layer is locating an intrinsic reactive-ion etching process stop, or etch-stop, which simplifies the optical via formation process. Simplifying the optical via formation process supports high-volume silicon wafer fabrication during manufacturing. Reactive-ion etching is an etching technology used in microfabrication. Reactive-ion etching uses chemically reactive plasma to remove material deposited on wafers. The plasma is generated under low pressure by an electromagnetic field. High-energy ions from the plasma attack the wafer surface and react with the wafer.

A parallel optical transceiver module assembly of illustrative embodiments flip-chip attach 2×N arrays of vertical cavity surface emitting lasers and photodiodes directly to a CMOS integrated circuit chip, which includes optical vias. These optical vias comprise two layers. One layer is a buried oxide layer over-laid by a CMOS dielectric stack. The other layer is an air layer where the silicon substrate has been removed between the buried oxide layer and the backside surface of the CMOS integrated circuit wafer.

Illustrative embodiments provide optical vias that are isolated from the CMOS dielectric stack layer of the wafer because the buried oxide layer serves both as a transparent layer for the input and output of optical signals, as well as, providing an integrated etch-stop for the optical via fabrication process. As a result, the critical top surface of the active circuitry of the CMOS integrated circuit does not undergo post-processing reactive-ion etching steps for the optical via formation, which ensures the reliability and functionality of the CMOS active circuitry. In addition, the thin top silicon layer of the wafer can be completely removed to provide a fully transparent optical via. In an alternative illustrative embodiment, the top silicon layer can remain intact at the optical via location. Retaining the top silicon layer in the optical via allows for the formation of photodetectors in this layer, which may be used to absorb a fraction of the light that passes through the top silicon layer for monitoring purposes.

For transmitter optoelectronic devices, these built-in photodetectors in the top silicon layer may be used as monitor photodetectors that detect the optical power output of the transmitter optoelectronic devices, and through feedback, adjust the bias currents of the transmitter optoelectronic devices to maintain constant power over both the temperature and the lifetime of the optoelectronic transmitters. For receiver optoelectronic devices, the built-in photodetectors may be used to monitor the incident direct current optical power independent of the operation of the high-speed photodiode in the receiver channel. Thus, illustrative embodiments enable monitoring functions using the built-in photodetectors in the top silicon layer, which are not provided by current optical transceiver modules.

Figure 2:
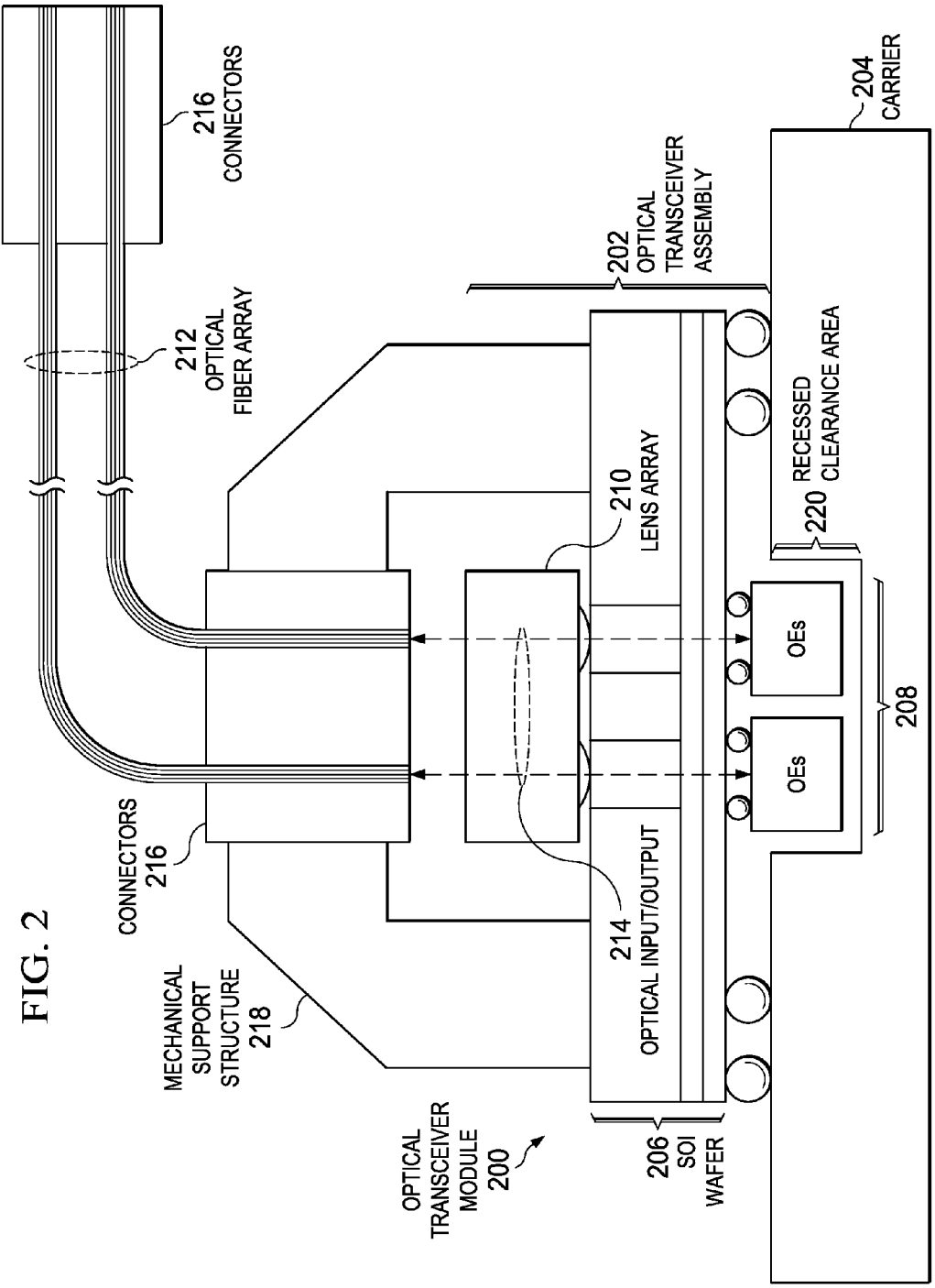
FIG. 2 is a diagram of a cross-section view of an optical transceiver module in accordance with an illustrative embodiment.

With regard to FIG. 2, a diagram of a cross-section view of an optical transceiver module is depicted in accordance with an illustrative embodiment. Optical transceiver module 200 includes optical transceiver assembly 202 and carrier 204. Optical transceiver assembly 202 may, for example, be optical transceiver assembly 100 in FIG. 1. Optical transceiver assembly 202 includes silicon-on-insulator wafer 206, optoelectronic devices 208, and lens array 210, such as silicon-on-insulator wafer 102, optoelectronic device 104, optoelectronic device 106, and lens array 108 included in optical transceiver assembly 100 in FIG. 1.

Optical transceiver assembly 202 is flip chip attached to carrier 204. Carrier 204 may, for example, be an organic or ceramic substrate, such as a printed circuit board. Carrier 204 mechanically supports, and electrically connects, optical transceiver module 200 to other electronic components within a data processing system.

Carrier 204 includes recessed clearance area 220. Recessed clearance area 220 is an area that is cutout of carrier 204 and is devoid of structure. Recessed clearance area 220 is used to accommodate a portion or all of the structure of optical transceiver assembly 202. Also, it should be noted that recessed clearance area 220 does not penetrate all the way through carrier 204. In other words, recessed clearance area 220 does not create a hole through carrier 204. Alternatively, the recessed clearance area may be fabricated as a hole through the carrier.

In this example, recessed clearance area 220 is a square or rectangular area bounded by carrier 204 on all four sides and on the bottom. However, it should be noted that recessed clearance area 220 may be any regular or irregular geometric shape and may not be entirely bounded by carrier 204. For example, recessed clearance area 220 may only be bounded by carrier 204 on three sides or two sides depending on whether recessed clearance area 220 is on an edge or a corner of carrier 204.

Optical transceiver assembly 202 is mechanically connected to optical fiber array 212 via mechanical support structure 218. Mechanical support structure 218 is a mechanical apparatus that is used to support and hold an optical fiber array connector, such as connectors 216. Connectors 216 are located at each end of optical fiber array 212. Connectors 216 are used to physically connect or fasten optical fiber array 212 to mechanical support structure 218. Mechanical support structure 218 also is used to align optical fiber array 212 over lens array 210. In this example, optical fiber array 212 is a 2×N array of optical fibers for transmitting and receiving pulses of light, such as optical input/output 214, which communicate data to and from optical transceiver assembly 202 via lens array 210. Optical input/output 214 may, for example, be optical input/output 120 in FIG. 1.

Thus, FIG. 2 illustrates a complete optical transceiver module that integrates the optical transceiver assembly of FIG. 1. After the optoelectronic devices are flip chip soldered to the CMOS integrated circuit chip or silicon-on-insulator wafer with optical vias and attached lens array, the entire optical transceiver assembly is flip chip soldered to a carrier to form the completed optical transceiver module. The carrier includes a recessed clearance area for the 2×N array of optoelectronic devices. In an alternative illustrative embodiment, the optoelectronic devices may be thinned so that the recessed clearance area is not required in the carrier.

The optical fiber array connector assembly is packaged on top of the optical transceiver assembly. The optical fiber array connector assembly completes an optical system that is the interface between the fiber ribbon array and the parallel optical transceiver module. In addition, the optical fiber array connector assembly may be designed to be in close thermal contact with the backside of the CMOS integrated circuit chip for transfer and removal of heat buildup. Furthermore, a second lens array may also be included with the optical fiber array assembly, which may, for example, be attached to the connector above the first lens array attached to the optical transceiver assembly.

Figure 3:
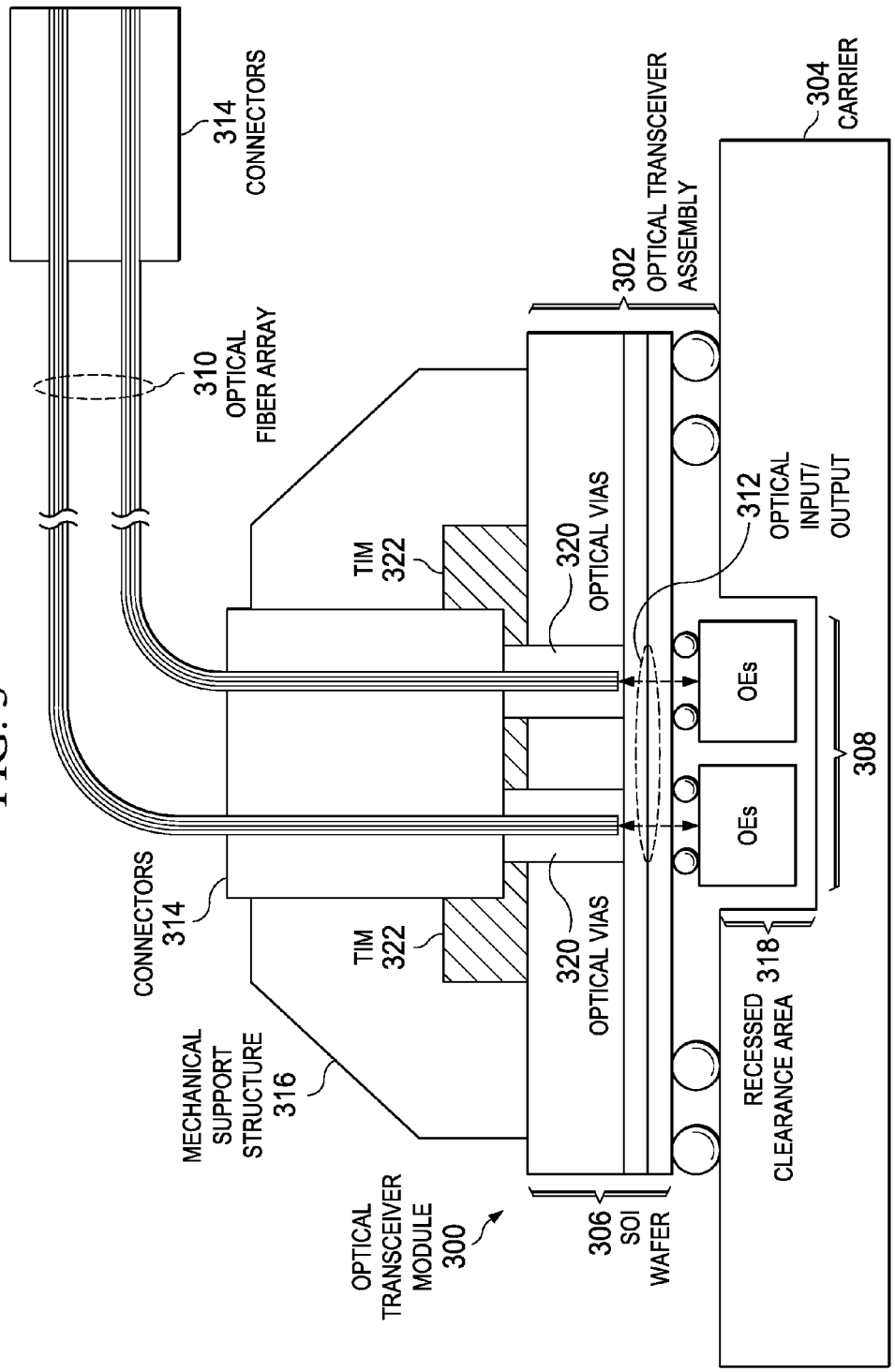
FIG. 3 is a diagram of a cross-section view of another optical transceiver module in accordance with an illustrative embodiment.

With regard to FIG. 3, a diagram of a cross-section view of another optical transceiver module is depicted in accordance with an illustrative embodiment. FIG. 3 illustrates an alternative embodiment by not incorporating a lens array, such as lens array 210 in FIG. 2, in the completed optical system. In this illustrative example, the optical fiber array is inserted into the optical vias of the optical transceiver assembly for direct optical coupling of the optical fiber array with the array of optoelectronic devices.

Optical transceiver module 300 includes optical transceiver assembly 302 and carrier 304. Optical transceiver assembly 302 includes silicon-on-insulator wafer 306 and optoelectronic devices 308, such as silicon-on-insulator wafer 206 and optoelectronic devices 208 in FIG. 2. Optical transceiver assembly 302 is flip chip attached to carrier 304. Carrier 304 may, for example, be carrier 204 in FIG. 2. Carrier 304 includes recessed clearance area 318, such as recessed clearance area 220 in FIG. 2. Recessed clearance area 318 accommodates all or a portion of the structure of optical transceiver assembly 302.

Optical transceiver assembly 302 is mechanically connected to optical fiber array 310 via mechanical support structure 316. Mechanical support structure 316 may, for example, be mechanical support structure 218 in FIG. 2. Connectors 314, such as connectors 216 in FIG. 2, are located at each end of optical fiber array 310. Connectors 314 physically connect optical fiber array 310 to mechanical support structure 316.

In this example, optical fiber array 310 is inserted into optical vias 320 for direct optical coupling of optical fiber array 310 with optoelectronic devices 308 via optical input/output 312. Optical input/output 312 may, for example, be optical input/output 214 in FIG. 2. In addition, thermal interface material (TIM) 322 is optionally placed between mechanical support 316, connector 314, and silicon-on-insulator wafer 306 for increased thermal coupling to dissipate heat. Thermal interface material 322 may, for example, be a thermally conductive paste, such as Shin-Etsu thermal paste, or a polymer adhesive, such as Sylguard adhesive.

Figure 4:
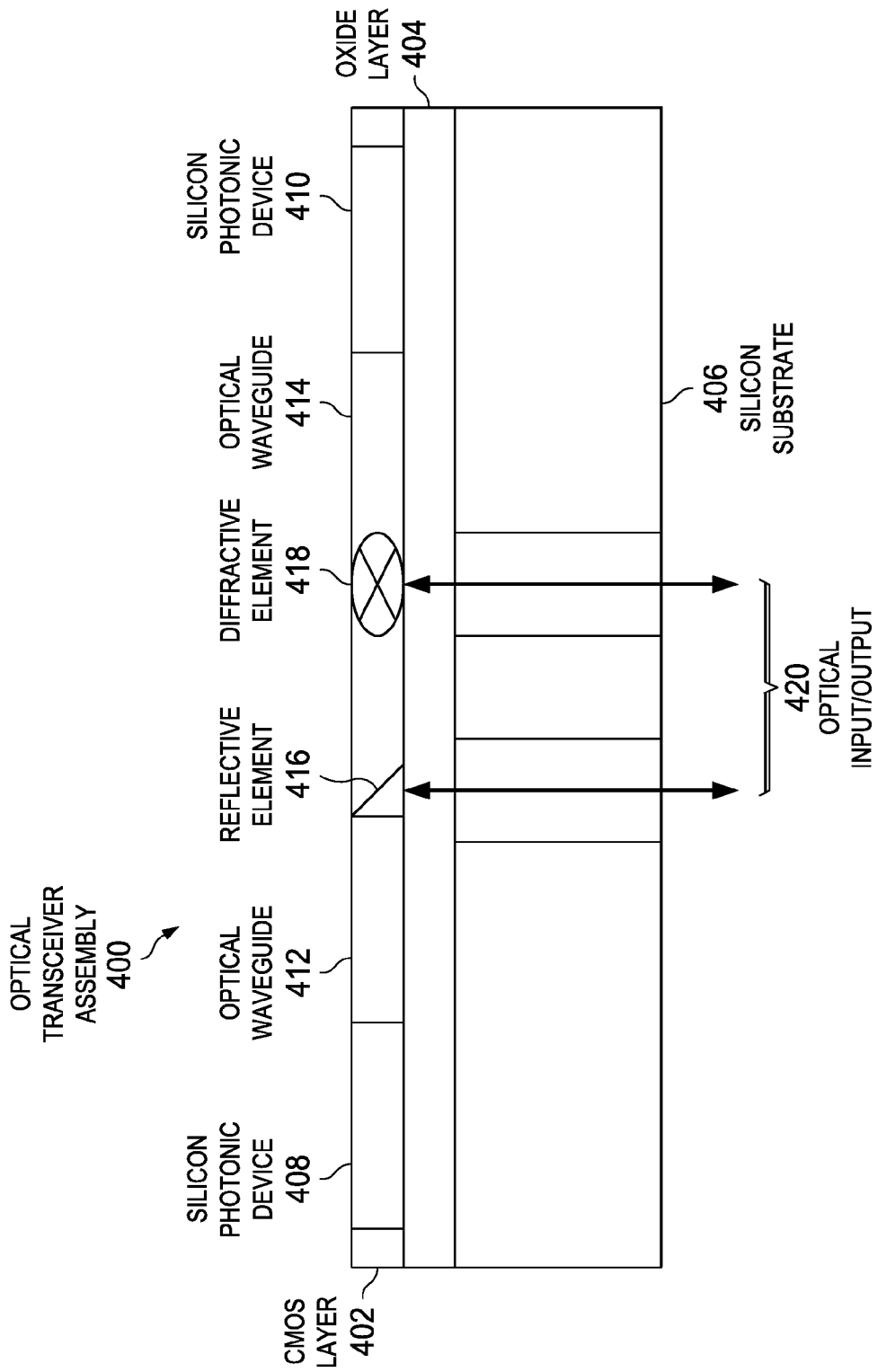
FIG. 4 is a diagram of a cross-section view of another optical transceiver assembly in accordance with an illustrative embodiment.

With regard to FIG. 4, a diagram of a cross-section view of another optical transceiver assembly is depicted in accordance with an illustrative embodiment. FIG. 4 illustrates an alternative embodiment by integrating an array of silicon photonic devices into the complementary metal-oxide-semiconductor layer of the optical transceiver assembly instead of flip chip attaching an array of optoelectronic devices on top of the complementary metal-oxide-semiconductor layer of the optical transceiver assembly, such as optoelectronic devices 104 and 106 flip chip attached on top of CMOS layer 110 in FIG. 1. A photonic device is any structure fabricated in the CMOS layer that guides, generates, manipulates, or detects pulses of light. Examples of photonic devices are lasers, optical modulators, photodetectors, and optical switches, with optical waveguides used for optical input and output.

Optical transceiver assembly 400 includes CMOS layer 402, oxide layer 404, and silicon substrate 406, such as CMOS layer 110, oxide layer 112, and silicon substrate 114 in FIG. 1. In this example, in addition to including active circuitry, CMOS layer 402 also includes silicon photonic device 408, silicon photonic device 410, optical waveguide 412, optical waveguide 414, reflective element 416, and diffractive element 418. In other words, silicon photonic device 408 and silicon photonic device 410 are integrally fabricated by a microlithographic process into the silicon of CMOS layer 402, along with optical waveguide 412, optical waveguide 414, reflective element 416, and diffractive element 418. In the case of the diffractive element, the addition of a metal layer above the diffractive element may be used to enhance the optical coupling efficiency.

Silicon photonic device 408 and silicon photonic device 410 represent a 2×N array of different types of photonic devices. For example, silicon photonic device 408 may represent an emitter or modulator for transmitting optical data signals and silicon photonic device 410 may represent a photodiode for receiving optical data signals. Thus, silicon photonic device 408 and silicon photonic device 410 together provide the optical transceiver capabilities of optical transceiver assembly 400.

Optical waveguide 412 and optical waveguide 414 are, for example, rectangular structures that guide optical signals or electromagnetic waves to and from silicon photonic device 408 and silicon photonic device 410, respectively. Optical waveguide 412 and optical waveguide 414 represent arrays of optical waveguides for guiding optical input/output 420 to and from the array of silicon photonic devices. Reflective element 416 is a microlithographically etched structure in CMOS layer 402 designed to reflect optical input/output 420 to and from silicon photonic device 408 via optical waveguide 412.

Similarly, diffractive element 418 is another microlithographically fabricated, for example etched structure, in CMOS layer 402 designed to diffract rather than reflect optical input/output 420 to and from silicon photonic device 410 via optical waveguide 414. One benefit of using diffractive element 418 is that diffractive element 418 may perform a plurality of optical operations simultaneously. However, it should be noted that even though in this example a combination of reflective and diffractive elements are used in optical transceiver assembly 400, alternate illustrative embodiments may use only reflective element 416 in optical transceiver assembly 400 or may use only diffractive element 418 in optical transceiver assembly 400.

In addition, it should be noted that either the lens-assisted optical coupling depicted in the example of FIG. 2 or direct optical fiber coupling depicted in the example of FIG. 3 may be used to provide the optical input and output for the integrated silicon photonic devices associated with optical transceiver device 400. Furthermore, it should be noted that in an alternative illustrative embodiment, the array of silicon photonic devices may be located on top of CMOS layer 402 instead of being integrated within CMOS layer 402.

Figure 5:
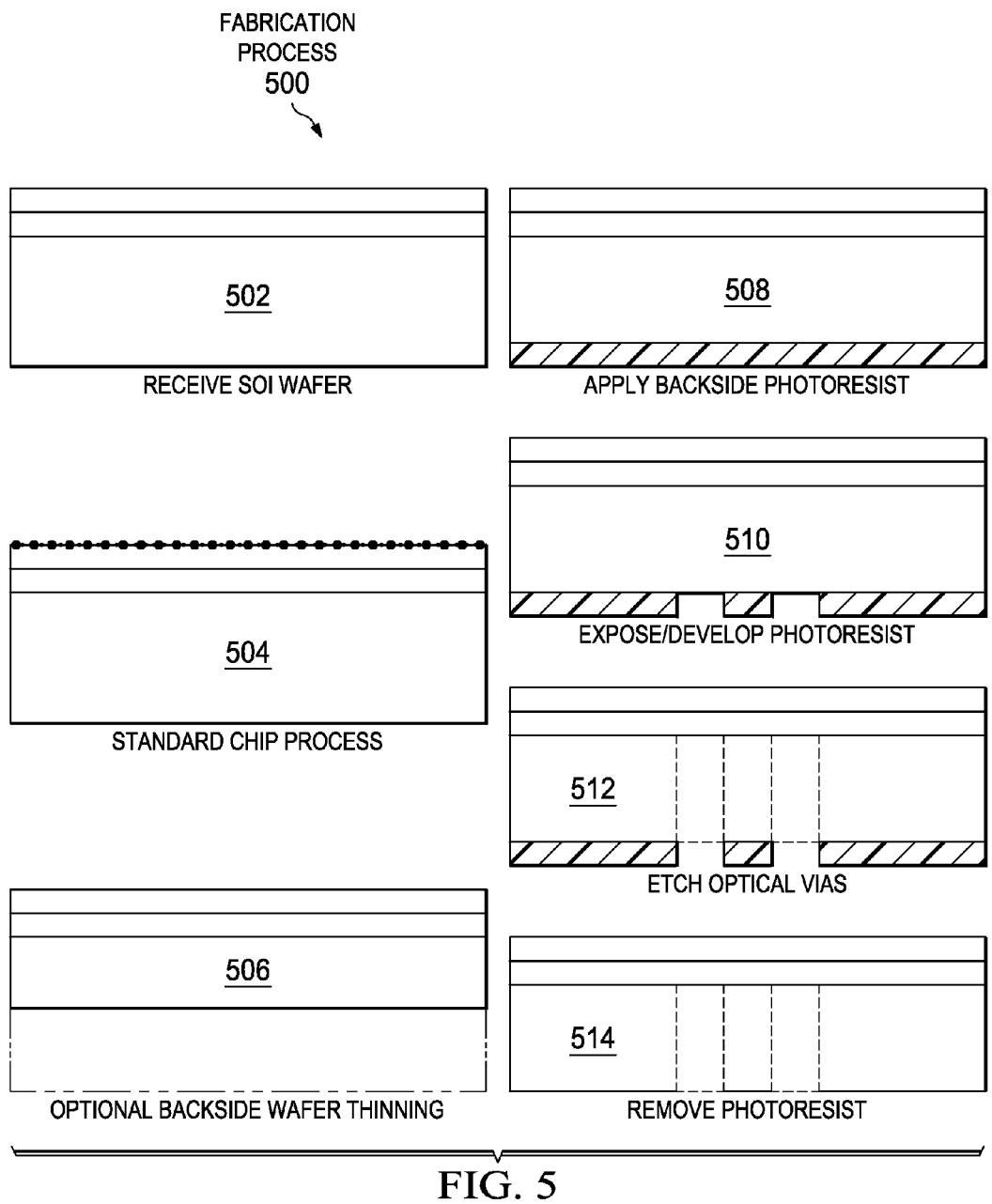
FIG. 5 is a pictorial illustration of a fabrication process for a silicon-on-insulator wafer in accordance with an illustrative embodiment.

With regard to FIG. 5, a pictorial illustration of a fabrication process for a silicon-on-insulator wafer is depicted in accordance with an illustrative embodiment. FIG. 5 illustrates an example of a fabrication process for manufacturing a silicon-on-insulator wafer, such as silicon-on-insulator wafer 102 in FIG. 1. Also, FIG. 5 is only meant as an example of a fabrication process for the silicon-on-insulator wafer and not intended as a limitation for illustrative embodiments. In other words, more or fewer steps may be included in the fabrication process or steps may be combined.

In the example, fabrication process 500 includes fabrication process steps 502, 504, 506, 508, 510, 512, and 514. Fabrication process step 502 includes receiving a silicon-on-insulator wafer for processing. Fabrication process step 504 includes frontside silicon-on-insulator wafer processing using standard chip processing procedures, such as treating the wafer by forming active circuits and conductive pads on the top silicon layer of the wafer for flip chip attachment of devices. Fabrication process step 506 includes an optional backside wafer thinning process, such as grinding, polishing, or etching. However, fabrication process step 506 does not have to be performed.

Fabrication process step 508 includes applying a backside photoresist layer to the wafer. The photoresist layer may, for example, be a thin film of photoresist material. Photoresist is a light-sensitive material used in photolithographic processes to form a patterned coating on a surface.

Fabrication process step 510 includes exposing the photoresist layer to light for patterning etching holes for optical vias. Fabrication process step 512 includes reactive-ion etching of the optical vias, such as optical vias 118 in FIG. 1. Fabrication process step 514 includes removing the photoresist layer from the backside of the wafer.

Thus, FIG. 5 illustrates a simplified fabrication process to form a silicon integrated circuit chip, which underpins the optical transceiver assembly. In addition, only one photolithographic step may be required to define the optical vias and other etched features for the passive mechanical alignment of a lens array on the backside of the wafer. After the silicon integrated circuit chip is completely processed, an array of optoelectronic devices, such as optoelectronic devices 104 and 106 in FIG. 1, are flip chip attached to the frontside of the silicon integrated circuit chip. In addition, a lens array, such as lens array 108 in FIG. 1, may be passively aligned and attached to the backside of the wafer with solder or an adhesive, such as epoxy.

Figure 6:
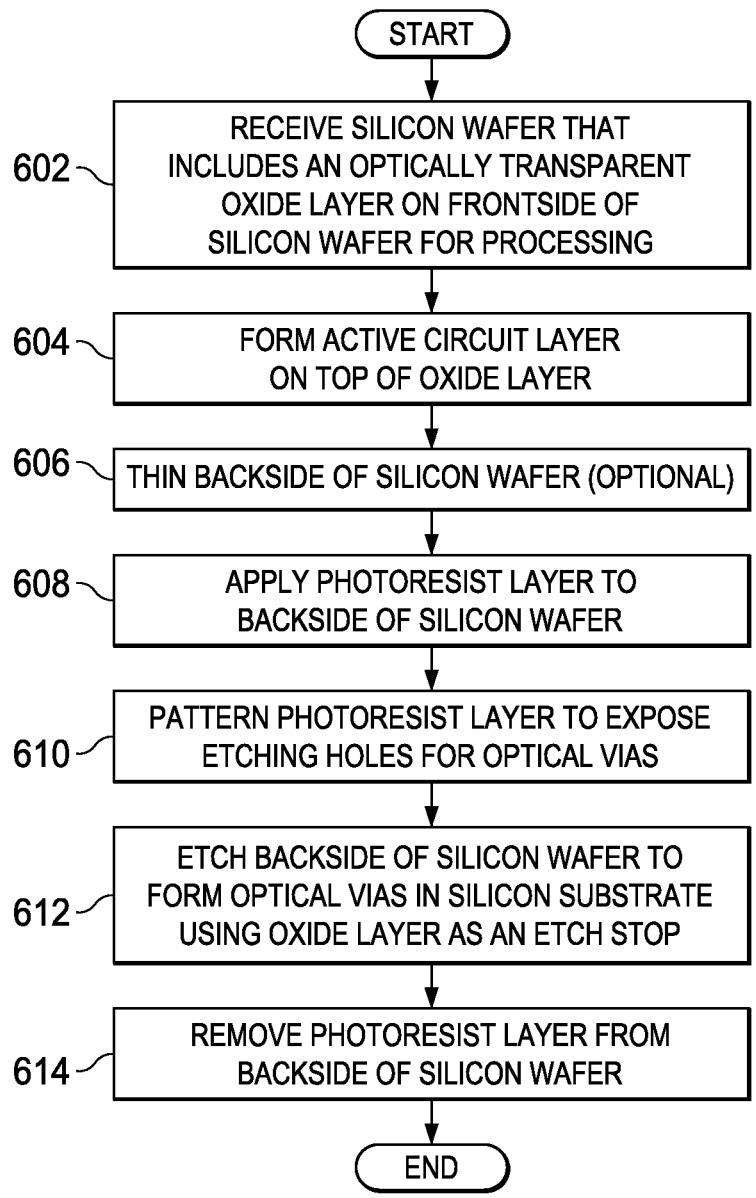
FIG. 6 is a flowchart illustrating a process for fabricating a silicon-on-insulator wafer in accordance with an illustrative embodiment.

With regard to FIG. 6, a flowchart illustrating a process for fabricating a silicon-on-insulator wafer is shown in accordance with an illustrative embodiment. The process shown in FIG. 6 may be implemented in a fabrication process, such as fabrication process 500 in FIG. 5.

The process begins when an assembler receives a silicon wafer, such as silicon-on-insulator wafer 102 in FIG. 1, for processing (step 602). The assembler may, for example, be a system of components that fabricates or assembles integrated circuit chips. The silicon wafer includes an optically transparent oxide layer, such as oxide layer 112 in FIG. 1, on a frontside of the silicon wafer. The oxide layer may, for example, be a silicon dioxide layer.

Then, the assembler forms an active circuit layer on top of the oxide layer (step 604). The active circuit layer may, for example, be a complementary metal-oxide-semiconductor layer, such as CMOS layer 110 in FIG. 1. Subsequently, the assembler thins a backside of the silicon wafer (step 606). However, it should be noted that thinning the backside of the silicon wafer is an optional step.

Then, the assembler applies a photoresist layer to the backside of the silicon wafer (step 608). After applying the photoresist layer in step 608, the assembler patterns the photoresist layer to expose etching holes for optical vias, such as optical vias 118 in FIG. 1 (step 610). In addition, the assembler may simultaneously pattern the photoresist layer to expose etching guides for passive mechanical alignment of a lens array, such as lens array 108 in FIG. 1.

Subsequently, the assembler etches the backside of the silicon wafer to form the optical vias in a silicon substrate, such as silicon substrate 114 in FIG. 1, using the oxide layer as an etch-stop (step 612). Also, the assembler may simultaneously etch the backside of the silicon wafer to form the passive mechanical alignment guides for the lens array. Then, the assembler removes the photoresist layer from the backside of the silicon wafer (step 614). The process terminates thereafter.

Thus, illustrative embodiments provide an improved parallel optical transceiver module using a complimentary metal-oxide-semiconductor chip with backside optical vias. The concept of backside optical vias fabricated into standard silicon-on-insulator wafers facilitates multiple options for optical coupling using both integrated silicon photonics and hybrid-integrated optical transceivers. One major feature of illustrative embodiments is that the top silicon layer, which includes the active circuitry, and the buried oxide layer are not disturbed during the fabrication process.

The optical vias of illustrative embodiments are fabricated from the backside of the silicon wafer using the buried oxide layer, which remains intact, as a stop for the reactive-ion etching process. The optical vias are blind holes in the silicon substrate. In other words, the silicon substrate of the wafer's backside is removed below the buried oxide layer in the optical via region, having the active circuitry layer retained and protected by the buried oxide layer. Therefore, illustrative embodiments do not form through holes in the silicon substrate, but rather retain the active circuitry in the optical via regions. In addition, the blind, not through, optical vias are not constructed as vertical waveguiding structures, but may instead be designed as receptacles for an array of optical fibers, for example.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A silicon-on-insulator wafer comprising:
   a silicon substrate having optical vias formed therein;
   a lens array is positioned on a backside of the silicon-on-insulator wafer in alignment with the optical vias for optical coupling;
   an optically transparent oxide layer disposed on the silicon substrate and in contact with the optical vias; and
   a complementary metal-oxide-semiconductor layer over the optically transparent oxide layer.

2. The silicon-on-insulator wafer of claim 1 wherein the optically transparent oxide layer is disposed between the silicon substrate on a backside of the silicon-on-insulator wafer and the complementary metal-oxide-semiconductor layer on a frontside of the silicon-on-insulator wafer, and wherein the optically transparent oxide layer is an etch-stop and remains intact during formation of the optical vias.

3. The silicon-on-insulator wafer of claim 2 wherein the optically transparent oxide layer protects active circuitry in the complementary metal-oxide-semiconductor layer during the formation of the optical vias.

4. The silicon-on-insulator wafer of claim 1 wherein the optical vias are not through holes in the silicon-on-insulator wafer, and wherein the optical vias are located on a backside of the silicon-on-insulator wafer.

5. The silicon-on-insulator wafer of claim 1 wherein an optical fiber array is mechanically connected to a backside of the silicon-on-insulator wafer.

6. The silicon-on-insulator wafer of claim 5 wherein a mechanical support for the optical fiber array is in thermal contact with the backside of the silicon-on-insulator wafer, and wherein a thermal interface material is placed between the mechanical support for the optical fiber array and the backside of the silicon-on-insulator wafer to remove heat from the silicon-on-insulator wafer.

* * * * *